United States Patent [19]

Palmer et al.

[11] Patent Number: 5,124,669
[45] Date of Patent: Jun. 23, 1992

[54] ONE-SHOT CIRCUIT FOR USE IN A PLL CLOCK RECOVERY CIRCUIT

[75] Inventors: Michael J. Palmer, Laguna Hills; Richard G. Yamasaki, Torrance, both of Calif.

[73] Assignee: Silicon Systems, Inc., Tustin, Calif.

[21] Appl. No.: 584,351

[22] Filed: Sep. 18, 1990

[51] Int. Cl.$^5$ .......................... H03K 3/284; H03L 7/06
[52] U.S. Cl. .................................. 331/1 A; 307/273; 307/288; 331/8; 331/25; 331/113 R
[58] Field of Search ............................ 331/1 A, 25, 8; 307/272.1, 288, 273

[56] References Cited

U.S. PATENT DOCUMENTS

| | | | |
|---|---|---|---|
| 3,673,559 | 6/1972 | Schwartz | 307/273 X |
| 3,719,835 | 3/1973 | Eberhard | 307/273 |
| 3,838,344 | 9/1974 | Tanimoto | 307/273 X |
| 4,017,806 | 4/1977 | Rogers | 331/1 A |

Primary Examiner—Siegfried H. Grimm
Attorney, Agent, or Firm—Hecker & Harriman

[57] ABSTRACT

A one-shot whose period is a fraction or multiple of the VCO period in a clock recovery circuit. In a clock recovery circuit using PLL, the one-shot is coupled to the PLL in order to enable/disable the phase detector for cases when the data stream does not consist of uniformly spaced pulses. Without a one-shot, the phase detector in the PLL generates a large error signal whenever a clock pulse occurs without a data pulse. During the times when the phase detector is enabled, a phase comparison is made between the next data edge and the next clock edge. When this comparison is completed, the phase detector is disabled again. In order for the PLL to average out the effects of noise and jitter, the phase detector is enabled one half clock period before the data edge. By doing this, the data edge can shift up to one half clock period. The one-shot of the present invention generates a delayed data signal whose rising edge is used to enable the phase detector, and whose falling edge is compared with the clock edge for disabling the phase detector.

14 Claims, 4 Drawing Sheets

ONE-SHOT CIRCUIT FOR USE IN A PLL CLOCK RECOVERY CIRCUIT

BACKGROUND OF THE INVENTION

1. Field of the Invention

This invention relates to the field of monostable multivibrators, and in particular monostable multivibrators used in circuits that require a controlled delay that is a fraction or multiple of a VCO period.

2. Background Art

Information is often transmitted in bit stream format. To accurately decode a serial bit stream, bit frames or bit windows must be accurately defined. A one-to-one correspondence exists between each bit and each frame or window. For a variety of reasons, data bit streams may include a degree of "jitter" which tends to force a data bit near or past a bit window boundary. To maximize the efficiency of data recovery in prior art, the average bit position is estimated and a decode window is defined having a nominal center coinciding with the average center bit position of the data stream. However, problems still exist when the jitter causes the bit position to extend over a window edge.

Prior art clock recovery circuits utilize phase locking via a phase locked loop (PLL) to generate one edge of a data window and utilize a quarter cell delay line to generate the other edge. In a clock recovery circuit, if the data stream does not consist of uniformly spaced pulses, the phase detector in the PLL generates a large signal error whenever a clock pulse occurs without a data pulse. To prevent this large error signal, a monostable multivibrator, or "one-shot", is implemented to disable the phase detector until a predetermined period before a data pulse. At this point, the one-shot enables the phase detector, and a phase comparison is made between the next data edge and the next clock edge. As soon as the comparison is finished, the phase detector is disabled.

Prior one-shots have been constructed using a combination of resistors and capacitors, and the one-shot period is a function of the RC time constants of the system. If implemented as an integrated circuit, process variations may affect the circuit timing. A typical integrated circuit process might have resistors with a ±10% tolerance and 1500 to 3000 ppm temperature coefficients, and capacitors with a ±10% tolerance and negligible temperature coefficients. Combined together, these tolerances and temperature coefficients can produce errors as large as 57% over a 100° C. change in temperature. To attain high accuracy, the prior art uses external components. These external components are highly undesirable since, on an integrated circuit, this means another pin must be added.

Therefore, it is an object of the present invention to provide a controlled delay that is a precise fraction or multiple of a VCO period.

It is another object of the present invention to cancel the effects of the component variations on one-shot timing.

SUMMARY OF THE PRESENT INVENTION

The present invention implements a one-shot whose period is a fraction or multiple of a VCO period in a clock recovery circuit. In a clock recovery circuit using a PLL, the one-shot is coupled to the PLL to enable the phase detector when the data stream does not consist of uniformly spaced pulses. Without a one-shot, the phase detector in the PLL generates a large error signal whenever a clock pulse occurs without a data pulse. During the times when the phase detector is enabled, a phase comparison is made between the next data edge and the next clock edge. When this comparison is completed, the phase detector is disabled again. In order for the PLL to average out the effects of noise and jitter, the phase detector is enabled one half clock period before the data edge. By doing this, the data edge can shift up to one half clock period before the phase detector generates an incorrect error signal. If the data edge is shifted further than one-half clock period, then the data edge is compared to a different rising clock edge and the detector generates an error. The one-shot of the present invention has been designed to generate a delayed data signal whose rising edge is used to enable the phase detector, and whose falling edge is compared with the clock edge for disabling the phase detector. The one-shot pulse length of the present invention is set to one half clock period.

The architecture of the one-shot of the present invention is an emitter coupled monostable multivibrator with a core architecture similar to a VCO of the PLL. Thus the control voltages have the same effect on the period of both circuits. By making the one-shot period a ratio of the VCO period, component variations over tolerance and temperature are cancelled out.

DETAILED DESCRIPTION OF THE PRESENT INVENTION

A one-shot whose period is a precise multiple or fraction of the VCO period in a clock recovery circuit is described. In the following description, numerous specific details, such as the number of transistors, voltage levels, etc. are described in detail in order to provide a more thorough description of the present invention. It will be apparent, however, to one skilled in the art, that the present invention may be practiced without these specific details. In other instances, well known features have not been described in detail so as not to obscure the invention.

The one-shot of the present invention is employed as a quarter cell delay circuit. A bit cell is equal to two VCO clock periods. The accurate quarter cell delay time is achieved by using the VCO control voltage to compensate the quarter cell delay one-shot circuit for process, temperature, and power supply induced timing variations.

Figure 1A:
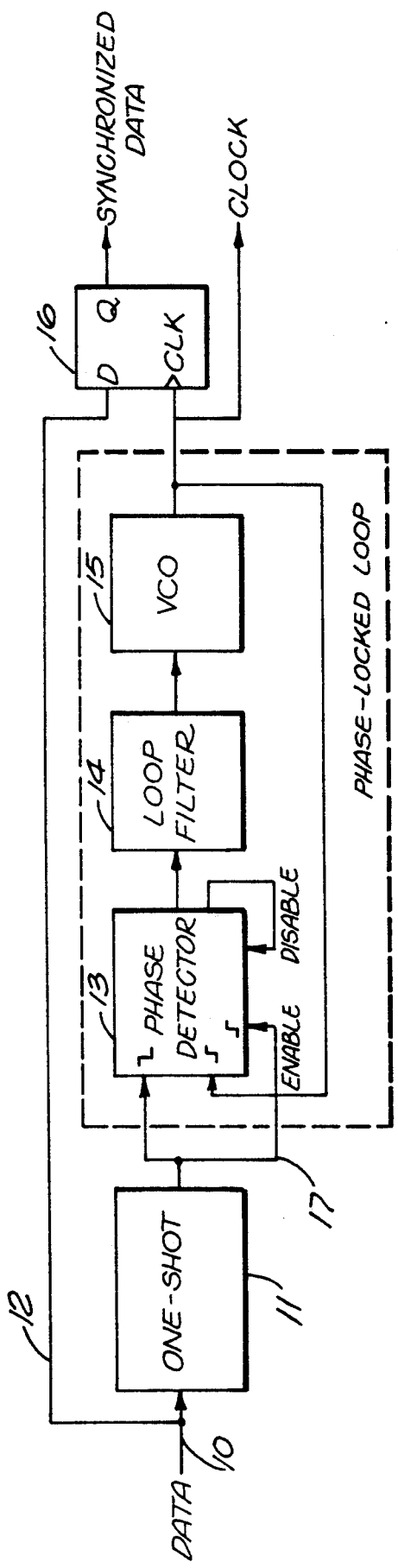
FIGS. 1A and 1B illustrate the block diagram and signal diagram for a simple clock recovery circuit using a PLL and a one-shot.

In the preferred embodiment, the present invention is used in conjunction with a PLL in a clock recovery circuit. Referring to FIG. 1A, a block diagram of a clock recovery circuit is illustrated. The data stream 10 is inputted into the one-shot 11 of the present invention. A bypass loop 12 couples the data stream 10 to the input of flip-flop 16 as well. The output of one-shot 11 is coupled to the first stage of the PLL, the phase detector 13. The one-shot of the present invention generates a delayed data signal 17, whose rising edge is used to enable the phase detector 13, and whose falling edge is compared with the rising clock edge in the phase detector 13. The output of phase detector 13 is coupled to the input of loop filer 14. The output of loop filter 14 is coupled to the input of the VCO, the last stage of the PLL. The output of VCO 15 is coupled to the clock input of flip-flop 16. The output of the VCO 15 is also coupled to the input of the phase detector 13. At the flip-flop, the data is then resynchronized with the clock, and the clock and resynchronized data signals are made available to other circuits.

Figure 1B:
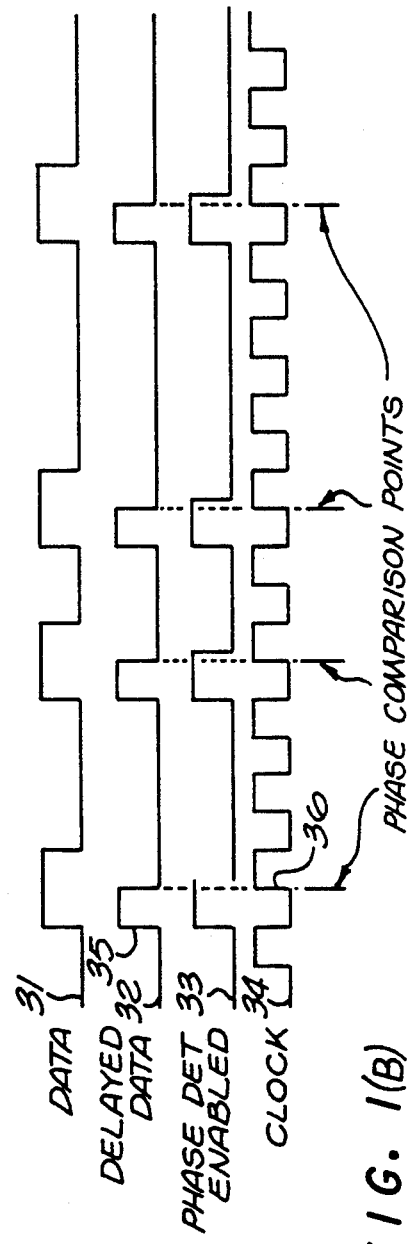

Referring to FIG. 1B, a signal diagram of the clock recovery circuit is illustrated. FIG. 1B illustrates how the one-shot generates the delayed data signal from the original data stream 31. The phase detector receives the delayed data signal 32 and it can be seen from the third signal 33 in FIG. 1B that the rising edge of the delayed data signal 35 is used to enable the phase detector. By looking at the clock signal 34, it can be seen that the phase comparison points 36 take place where the falling edge of the delayed data signal is compared with the clock edge in the phase detector. At this comparison point the phase detector is disabled. Ideally, the one-shot enables the phase detector one half of a VCO clock period before the phase comparison takes place. A data bit could then shift early or late by one half of a period before a phase detector output error occurs.

Figure 2:
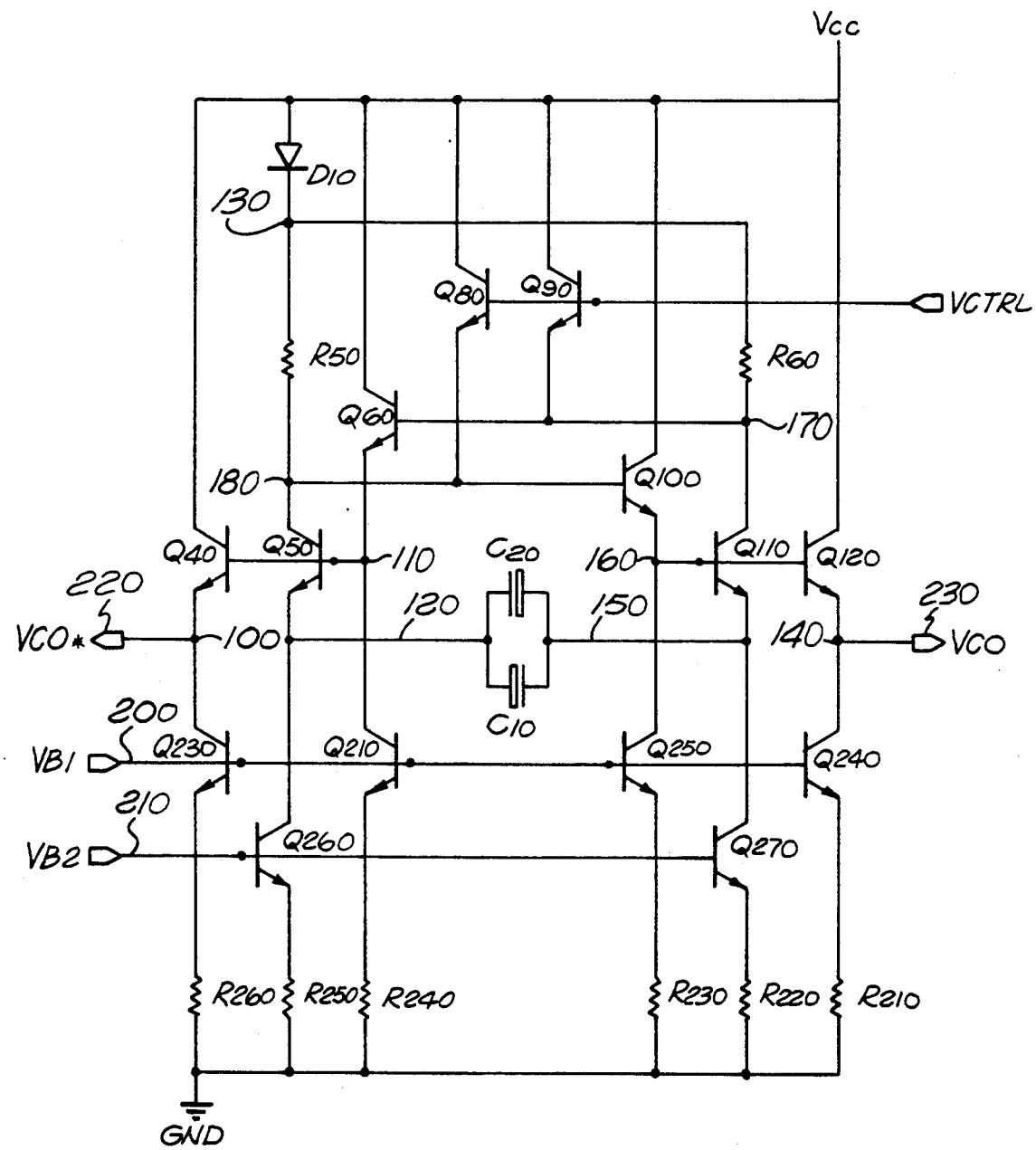
FIG. 2 is a circuit diagram of an emitter coupled VCO.

Because the one-shot of the present invention is modeled after the architecture of a VCO, analysis of an operating VCO is provided. An emitter coupled VCO schematic is illustrated in FIG. 2. The bases of transistors Q40 and Q50 are coupled to the emitter of transistor Q60 and coupled to the collector of transistor Q210 at node 110. The collector of transistor Q40 is coupled to supply voltage VCC. The collector of transistor Q50 is coupled to the emitter of transistor Q80 and coupled to the base of transistor Q100 as well as being coupled to the negative terminal of diode D10 through resistor R50 all at node 180. The emitter of transistor Q40 is coupled to the collector of transistor Q230 at node 100, providing output voltage VCO*220. The bases of transistors Q210, Q230, Q240 and Q250, are all coupled to input voltage VB1 at node 200. The emitter of transistor Q230 is coupled to ground through resistor R260. The emitter of transistor Q210 is coupled to ground through resistor R240. The emitter of transistor Q250 is coupled to ground through resistor R230. The emitter of transistor Q240 is coupled to ground through resistor R210. The emitter of transistor Q50 is coupled to the collector of transistor Q260 and also coupled to parallel capacitors C10 and C20 at node 120.

The bases of transistors Q260 and Q270 are coupled to input voltage VB2 at node 210. The emitter of transistor Q260 is coupled to ground through resistor R250. The emitter of transistor Q270 is coupled to ground through resistor R220. The collector of transistor Q270 is coupled to the emitter of transistor Q110 and also coupled to parallel capacitors C10 and C20 at node 150. The bases of transistors Q110 and Q120 are coupled to the emitter of transistor Q100 and also coupled to the collector of transistor Q250 at node 160. The emitter of transistor Q120 is coupled to the collector of transistor Q240 at node 140, providing output voltage 230 of the VCO.

The collector of transistor Q110 is coupled to the base of transistor Q60, to the emitter of transistor Q90 and to node 130 through resistor R60 all at node 170. The bases of transistors Q80 and Q90 are coupled to control voltage $V_{CTRL}$. The collector of transistor Q80 is coupled to supply voltage $V_{CC}$. The collector of transistor Q90 is coupled to supply voltage $V_{CC}$. The positive terminal of diode D10 is coupled to supply voltage $V_{CC}$.

The VCO is an emitter coupled multivibrator, whose frequency is adjusted either by changing the voltage swing across the timing capacitor or by changing the timing capacitor charging current. The timing capacitor consists of capacitors C10 and C20, connected in parallel. The voltage at the $V_{CTRL}$ pin controls the voltage swing across the timing capacitor, and the voltage at the VB2 pin controls the timing capacitor charging current. Changing either one of these voltages will change the VCO period.

The VCO analysis proceeds by assuming that transistor Q50 is turned off, but is near the threshold of turning on. Since transistor Q50 is turned off, no current flows through R50 and the base of transistor Q100 is pulled up to $V_{CC}-\phi D10$. The emitter of transistor Q110 is at $V_{CC}-\phi_{D10}-\phi_{100}-\phi_{110}$ where $\phi_{100}$ and $\phi_{110}$ are the base-to-emitter voltages of transistors Q100 and Q110, respectively. $\phi_{D10}$ refers to the diode voltage drop across diode $D_{10}$. Assuming that VBE's are matched, the emitter of transistor Q110 is at $V_{CC}-3\phi$. Q110 is turned on, and the collector voltage of Q110 is clamped by the emitter of Q90 to $V_{CTRL}-\phi 90=V_{CTRL}-\phi$. The base of Q50 is at $V_{CTRL}-\phi_{90}-\phi_{60}=V_{CTRL}-2\phi$. Just before Q50 turns on, the voltage at the emitter of Q50 is approximately $V_{CTRL}-3\phi$.

When Q50 turns on, the collector of Q50 pulls down, and is clamped by the emitter of Q80 to $V_{CTRL}-\phi$. The base of Q110 is pulled down from $V_{CC}-2\phi$ to $V_{CTRL}-2\phi$. Since the voltage across C10 and C20 cannot change instantaneously, the emitter of Q110 remains at $V_{CC}-3\phi$, and Q110 turns off. When Q110 turns off, the base of Q60 pulls up to $V_{CC}-\phi$, and the emitter of Q50 pulls up to $V_{CC}-3\phi$. When the emitter of Q50 pulls up, the emitter of Q110 is pulled up by the same amount, again because the voltage across the capacitor cannot change instantaneously.

At the moment of switching, the voltage change at the emitter of Q50 is equal to the voltage change at the emitter of Q110. At the emitter of Q50, the voltage change is $V_{CC}-3\phi-(V_{CTRL}-3\phi)=V_{CC}-V_{CTRL}$. Just after switching, the emitter of Q110 is at $V_{CC}-3\phi+V_{CC}-V_{CTRL}=2V_{CC}-3\phi-V_{CTRL}$. The current in Q270 discharges the voltage on C10 and C20 until the next switching point is reached, when Q110 turns on again. This occurs when the voltage on the emitter of Q110 discharges to $V_{CTRL}-3\phi$. The total voltage discharged from C10 and C20 is $2V_{CC}-3\phi-V_{CTRL}-(V_{CTRL}-3\phi)=2(V_{CC}-V_{CTRL})$. The collector current in Q270 is given by $(VB2-\phi_{270})/R220$. Assuming that the collector currents in Q260 and Q270 are the same, the time that Q110 is off is one half of a VCO period, with the other half period being the time when Q50 is off. The time that each transistor is off is the same. The total period is then twice the time that Q110 is off.

$$T_{VCO} = \frac{2C_t \Delta V}{I_{C270}} = \frac{4R_{220}(C_{10}+C_{20})(V_{CC}-V_{CTRL})}{VB2-\phi_{270}}$$

where:

$C_t = C10 + C20$ $\Delta V = 2(V_{CC} - V_{CTRL})$ $I_{C270} = (V_{B2} - \phi_{270})/R220$ Thus, by controlling the amout of current flowing through transistor Q270, the timing of the VCO period can be set and controlled. Furthermore, we see the VCO period is also set by control voltage $V_{CTRL}$.

Figure 3:
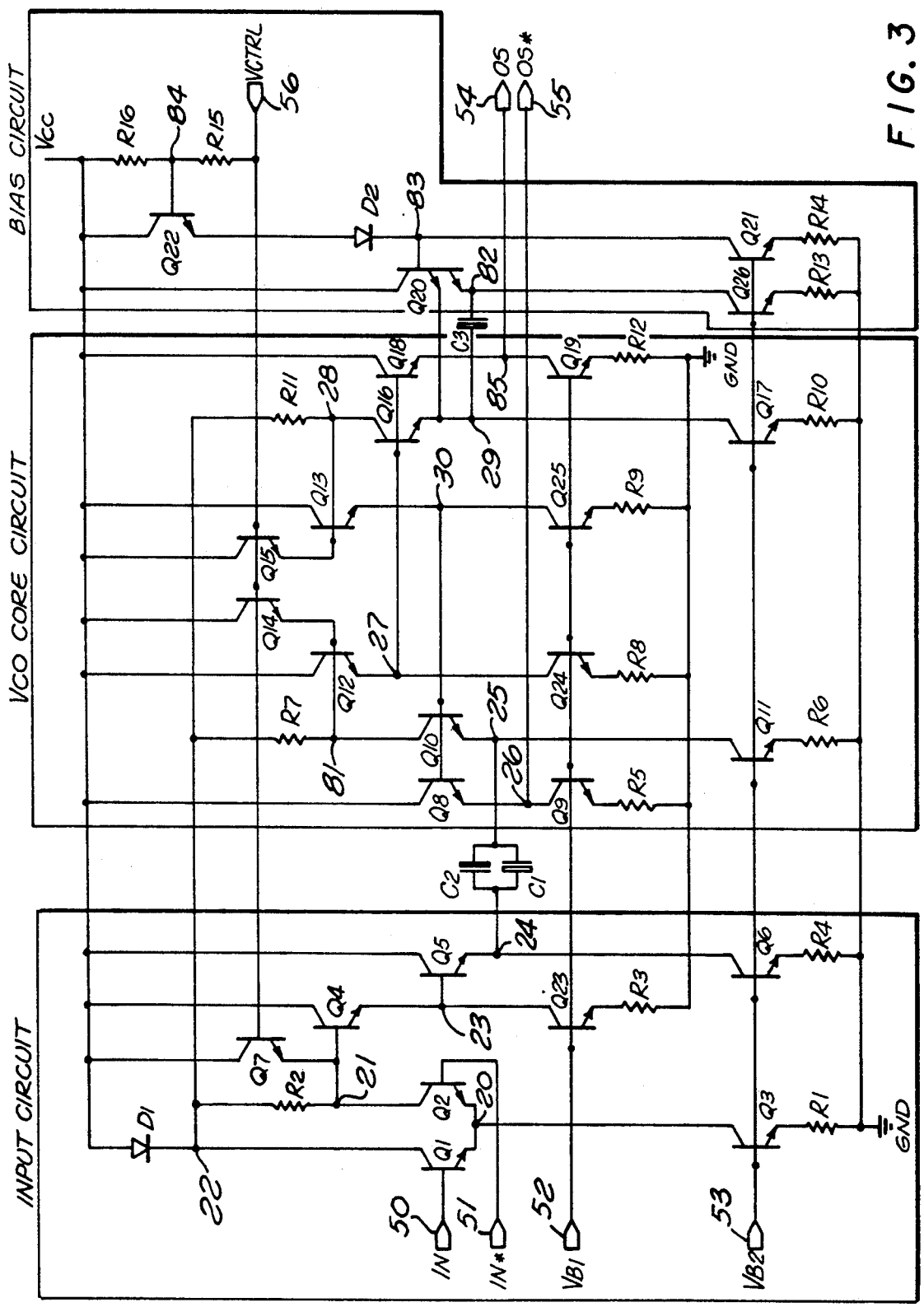
FIG. 3 is a circuit diagram of the one-shot of the preferred embodiment of the present invention.

The preferred embodiment of the present invention is illustrated in FIG. 3. FIG. 3 is an emitter coupled one-shot, with a core architecture similar to the VCO of the PLL. The one-shot is constructed this way so that the control voltages have the same effect on the period of both circuits to compensate for process, temperature and power supply-induced variations. Transistors Q8-Q19, Q24 and Q25, and resistors R5-R12 form the core architecture of the one-shot, and are in the same configuration as the VCO. Transistors Q1-Q7, and Q23, and resistors R1-R4 form the input circuit. Transistors Q20-Q22, and Q26, and resistors R13-R16 form a biasing circuit.

The input circuit begins at input voltage IN 50 which is coupled to the base of transistor Q1. The emitter of transistor Q1 is coupled to the emitter of transistor Q2 as well as coupled to the collector of transistor Q3 at node 20. The base of transistor Q2 is coupled to the input voltage IN*51. The collector of transistor Q1 is coupled to the negative terminal of diode D1 as well as coupled to resistors R2, R7 and R11 at node 22. The collector of transistor Q2 is coupled to the base of transistor Q4, the emitter of transistor Q7 and resistor R2 at node 21. The base of transistor Q7 is coupled to control voltage $V_{CTRL}$ 56. The collector of transistor Q7 is coupled to the supply voltage $V_{CC}$. The positive terminal of diode D1 is coupled to supply voltage $V_{CC}$. The collector of transistor Q4 is coupled to the supply voltage $V_{CC}$. The emitter of transistor Q4 is coupled to the base of transistor Q5 and also coupled to the collector of transistor Q23 at node 23. The base of transistor Q23 is coupled to the input voltage VB1 52. The emitter of transistor Q23 is coupled to ground through resistor R3.

The collector of transistor Q5 is coupled to supply voltage $V_{CC}$. The emitter of transistor Q5 is coupled to the collector of transistor Q6 and also coupled to parallel capacitors C1 and C2 at node 24. The emitter of transistor Q6 is coupled to ground through resistor R4. The bases of transistors Q3 and Q6 are coupled to input voltage VB2 53. The emitter of transistor Q3 is coupled to ground through resistor R1.

Concerning the core architecture of the one-shot, the collector of transistor Q8 is coupled to supply voltage $V_{CC}$. The base of transistor Q8 as well as the base of transistor Q10 is coupled to the emitter of transistor Q13 and also coupled to the collector of transistor Q25 at node 30. The emitter of transistor Q8 is coupled to the collector of transistor Q9 at node 26, providing output voltage OS*. The bases of transistors Q9, Q24, Q25 and Q19 are all coupled to input voltage VB1. The emitter of transistor Q9 is coupled to ground through resistor R5. The emitter of transistor Q10 is coupled to parallel capacitors C1 and C2, and also coupled to the collector of transistor Q11 at node 25. The bases of transistors Q11, Q17, Q26, and Q21 are coupled to the input voltage VB2 53. The emitter of transistor Q11 is coupled to ground through resistor R6. The collector of transistor Q10 is coupled to node 22 through resistor R7, and also coupled to the base of transistor Q12 as well as the emitter of transistor Q14 at node 81.

The collector of transistor Q12 is coupled to the supply voltage $V_{CC}$. The emitter of transistor Q12 is coupled to the collector of transistor Q24, and also coupled to the bases of transistors Q16 and Q18 at node 27. The emitter of transistor Q24 is coupled to ground through resistor R8. The bases of transistors Q14 and Q15 as well as resistor R15 are coupled to the control voltage $V_{CTRL}$ 56. The collectors of transistors Q14 and Q15 are coupled to supply voltage $V_{CC}$. The emitter of transistor Q15 is coupled to the base of transistor Q13 at node 28. Node 28 is also coupled to node 22 through resistor R11 and also coupled to the collector of transistor Q16. The emitter of transistor Q16 is coupled to a first emitter of transistor Q20 and through capacitor C3 to a second emitter of transistor Q20. The emitter of transistor Q16 is also coupled to the collector of Q17 at node 29. The emitter of transistor Q17 is coupled to ground through resistor R10. The collector of transistor Q18 is coupled to voltage supply $V_{CC}$. The emitter of transistor Q18 is coupled to the collector of transistor Q19 at node 85, and this is where the output voltage OS is taken from. The emitter of transistor Q19 is coupled to ground through resistor R12.

Concerning the bias circuit, the collector of transistor Q20 is coupled to voltage supply $V_{CC}$. The second emitter of transistor Q20 is coupled to the collector of transistor Q26 at node 32. The emitter of transistor Q26 is coupled to ground through resistor R13. The emitter of transistor Q21 is coupled to ground through resistor R14. The collector of transistor Q21 is coupled to the base of transistor Q20, and also coupled to the negative terminal of diode D2 at node 83. The positive terminal of diode D2 is coupled to the emitter of transistor Q22. The collector of transistor Q22 is coupled to voltage supply $V_{CC}$. The base of transistor Q22 is coupled to voltage supply $V_{CC}$ through resistor R16, and also coupled to control voltage $V_{CTRL}$ through resistor R15 at node 84.

Assume the circuit of FIG. 3 is in the "reset" state. A "reset" state in the one-shot is when no data pulse has been received and the one-shot does not generate the delayed data pulse until the data pulse has been received. At this point, the one-shot is in the "set" state. Input voltage IN is low, while IN* is high so that transistor Q2 is conducting. The current through transistor Q2 is large enough so that transistor Q7 is turned on, and clamps the voltage at the base of transistor Q4 to $(V_{CTRL} - \phi_7)$ where $\phi_7$ is the base-emitter voltage drop in transistor Q7($\sim$0.5–0.7 V). Due to these base-emitter voltage drops, the voltage at the emitter of transistor Q5 is $(V_{CTRL} - \phi_7 - \phi_4 - \phi_5)$. Assuming that the VBE's for all transistors are matched, this voltage is approximately $V_{CTRL} - 3\phi$. Assume transistor Q10 is on, forcing the voltage at the base of Q12 to be $V_{CTRL} - \phi_{14}$. Since the base of transistor Q16 is coupled to the emitter of transistor Q12 at node 27, the voltage at the base of transistor Q16 is $(V_{CTRL} - \phi_{14} - \phi_{12}) = V_{CTRL} - 2\phi$. The voltage at the base of transistor Q22 is based on a voltage divider scheme between $V_{CTRL}$ and $V_{CC}$. The voltage at the base of transistor Q22 is:

$$\left( V_{CTRL} + \frac{R15(V_{CC} - V_{CTRL})}{(R15 + R16)} \right)$$

Therefore, the voltage at the base of transistor Q20 is:

$$V_{CTRL} + \frac{R15(V_{CC} - V_{CTRL})}{R15 + R16)} - \phi_{22} - \phi_{D2}$$

Since the voltage at the emitter of transistor Q16 is clamped by the voltage at the first emitter of transistor Q20, the voltage of the emitter of transistor Q16 is $$V_{CTRL} + \frac{R15(V_{CC} - V_{CTRL})}{R15 + R16)} - \phi_{22} - \phi_{D2} - \phi_{20} =$$

$$\left(V_{CTRL} + \frac{R15(V_{CC} - V_{CTRL})}{(R15 + R16)}\right) - 3\phi$$

Note that the voltage at the emitter of transistor Q20 can also be written as:

$$V_{CC} - \frac{R16(V_{CC} - V_{CTRL})}{R15 + R16)} - \phi_{22} - \phi_{D2} - \phi_{20} =$$

$$V_{CC} - \frac{R16(V_{CC} - V_{CTRL})}{(R15 + R16)} - 3\phi$$

Comparing the base and emitter voltages of transistor Q16, the base-emitter voltage of transistor Q16 is smaller than the turn-on voltage, so transistor Q16 is off. With transistor Q16 off, the base voltage of transistor Q13 is pulled up to $V_{CC} - \phi_{D1}$ by R11. Since the base of transistor Q13 is pulled up, transistor Q10 is on. The voltage at the emitter of transistor Q10 is $V_{CC} - \phi_{D1} - \phi_{13} - \phi_{10} = V_{CC} - 3\phi$. Thus the voltage across capacitors C1 and C2 when IN is low and IN* is high $V_{CC} - 3\phi - (V_{CTRL} - 3\phi) = V_{CC} - V_{CTRL}$.

The one-shot timing begins when the IN signal goes high, and the IN* signal goes low. This turns transistor Q2 off, and R2 pulls the base of transistor Q4 up to $V_{CC} - \phi_{D1}$. The emitter of transistor Q5 now pulls up to $(V_{CC} - \phi_{D1} - \phi_4 - \phi_5) = V_{CC} - 3\phi$. Because the voltage across a capacitor cannot change instantaneously, the emitter of transistor Q10 pulls up to $(V_{CC} - V_{CTRL}) + (V_{CC} - 3\phi) = 2V_{CC} - 3\phi - V_{CTRL}$. As the emitter of transistor Q10 gets pulled up, transistor Q10 turns off, and resistor R7 pulls the base of transistor Q12 up to $V_{CC} - \phi_{D1} = V_{CC} - \phi$. The emitter of transistor Q12 pulls up to $V_{CC} - \phi_{D2} - \phi_{12} = V_{CC} - 2\phi$, and the emitter of transistor Q16 pulls up to $V_{CC} - \phi_{D1} - \phi_{12} - \phi_{16} = V_{CC} - 3\phi$. The emitter of transistor Q16 is now at a higher voltage than the emitter of transistor Q20, which from above, is at:

$$\left(V_{CC} - \frac{R16(V_{CC} - V_{CTRL})}{(R15 + R16)} - 3\phi\right),$$

so transistor Q16 turns on.

Since transistor Q16 turns on, the base of transistor Q13 is pulled down to $V_{CTRL} - \phi_{15} = V_{CTRL} - \phi$.

The base of transistor Q10 is pulled down to $V_{CTRL} - \phi_{15} - \phi_{13} = V_{CTRL} - 2\phi$. Since the emitter of transistor Q10 pulled up to $2V_{CC} - 3\phi - V_{CTRL}$, and $2V_{CC} - 3\phi - V_{CTRL} < V_{CTRL} - 3\phi$ (provided that $V_{CTRL} < V_{CC}$), transistor Q10 is turned off. The current from transistor Q11 will discharge capacitors C1 and C2 until the voltage at the emitter of transistor Q10 is $V_{CTRL} - 3\phi$. The time until this happens is given by:

$$T = \frac{C\Delta V}{I}$$

where $C = C_1 + C_2$, $\Delta V$ is the voltage that discharges across the capacitor, and I is the collector current of transistor Q11, which is $(V_{B2} - \phi_{11})/R6$. Substituting the values derived above $\Delta V = \geq V_{CC} - 3\phi - V_{CTRL} - (V_{CTRL} - 3\phi) = 2(V_{CC} - V_{CTRL})$. The width of the one-shot pulse is:

$$\frac{2R6(C1 + C2)(V_{CC} - V_{CTRL})}{V_{B2} - \phi_{11}}$$

$$T_{OS} = \frac{C_T \Delta V}{I_{C11}}$$

$$C_T = C1 + C2$$
$$\Delta V = 2(V_{CC} - V_{CTRL})$$
$$I_{C11} = (V_{B2} - \phi_{11})/R6$$

Note that it has been assumed that R6=R10, and $\phi_{11} = \phi_{17}$. Capacitors C1 and C2 in the one-shot are not connected to the emitter of transistor Q16, (as they would be in an a stable circuit like VCO). Because of this, when transistor Q10 turns on at the end of the one-shot period, it does not initiate another timing cycle. When transistor Q10 turns on, the base of transistor Q16 is pulled down, and transistor Q16 turns off because of capacitor C3 being coupled to the emitter of transistor Q20. Ideally, this capacitor only needs to be large enough to cause transistor Q16 to turn off as the base voltage on Q16 falls. Transistor Q16 would turn off regardless, as soon as the emitter of transistor Q16 fell to a lower voltage then the emitter of transistor Q20. However, the time delay introduced as a result of the final slope of transistor Q16's base voltage would introduce unacceptable errors in high speed applications.

Figure 4:
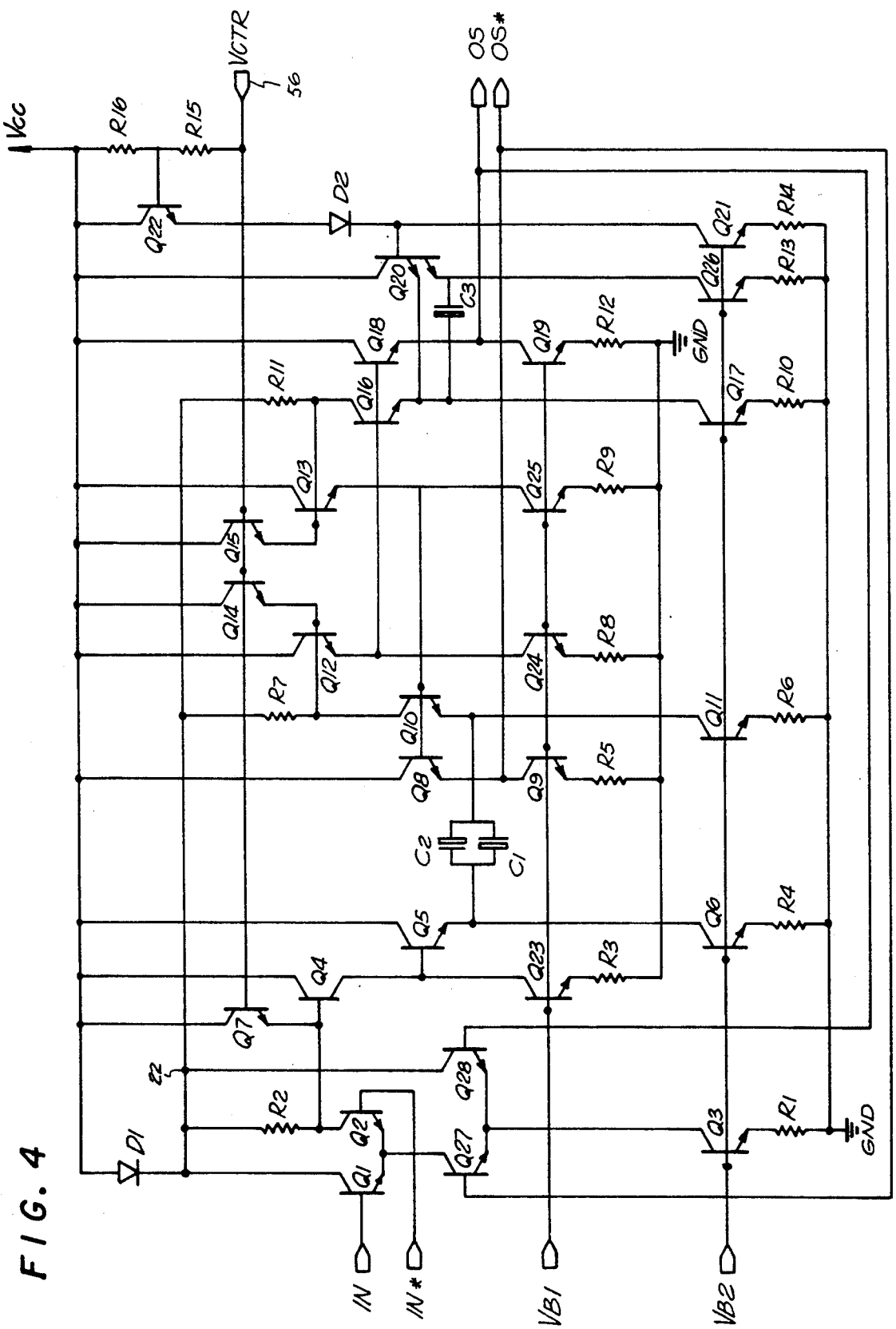
FIG. 4 is a circuit diagram of a modification of the circuit in FIG. 3.

An alternate embodiment of the present invention is illustrated in FIG. 4. The circuit of FIG. 3 resets immediately if the input is not held high for the entire duration of the one-shot output pulse. Inputs with a short pulse duration can be accommodated by either externally logical ORing the input signal with the one-shot output, or by logical ORing the input with the output internally, as shown in FIG. 4. In FIG. 4, transistors Q27 and Q28 provide the OR function, and ensure that the collector of transistor Q2 remains high $(V_{CC} - \phi)$ until OS and OS* outputs go low. The current in transistor Q6 only needs to be large enough to guarantee that capacitors C1 and C2 can be discharged before the next trigger pulse at the IN and IN* inputs. The architecture of FIG. 4 is substantially the same as the architecture of FIG. 3 with the exception of the addition of the emitter coupled pair of transistors Q27 and Q28. The collector of transistor Q27 is coupled to the emitters of transistors Q1 and Q2, and the collector of transistor Q28 is coupled to node 22. The emitters of transistors Q27 and Q28 are coupled to the collector of transistor Q3. The bases of transistors Q27 and Q28 are coupled to the outputs OS* and OS, respectively.

Thus, a monostable multivibrator has been described.

We claim:

1. A one-shot circuit for a clock recovery circuit including a VCO coupled to a phase detector comprising:
   an input means for receiving an input data signal and providing a first output signal;

a timing means, coupled to said input means and receiving said first output signal, for controlling width of an output one-shot signal;

voltage controlling means coupled to said timing means, said voltage controlling means producing one cycle of said output one-shot signal for each input data signal, said voltage controlling means having substantially the same core architecture as said VCO;

a biasing means coupled to said voltage controlling means, said biasing means providing a voltage biasing signal to said voltage controlling means;

a voltage control signal coupled to said VCO for controlling a VCO clock period generated by said VCO, said voltage control signal also coupled to said biasing means for controlling said voltage biasing signal.

2. The circuit of claim 1 wherein the pulse width of said output one-shot signal is set to one half clock period.

3. The circuit of claim 2 wherein said phase detector of said clock recovery circuit is enabled by a rising edge of said output one-shot signal.

4. A clock recovery circuit comprising:
a one-shot receiving an input data signal and generating an output delayed data signal;
a phase detector enabled by said output delayed data signal of said one-shot and coupled to said one-shot;
a voltage controlled oscillator coupled to said phase detector, providing a VCO clock signal to said phase detector;
said one-shot including voltage controlling means providing a pulse width of said output delayed data signal from said one-shot so that said pulse width is a ratio of a period of said VCO.

5. The circuit of claim 4 wherein the pulse width of said output delayed data signal from said one-shot is set to one half VCO clock period.

6. The circuit of claim 5 wherein said phase detector is enabled by a rising edge of said output delayed data signal from said one-shot and disabled by a rising edge of said VCO clock signal.

7. The circuit of claim 6 wherein a voltage control signal sets the timing of both of said one-shot and said VCO clock period.

8. The circuit of claim 7 wherein said one-shot creates one cycle of output for each input data signal received by said one-shot.

9. The circuit of claim 3 wherein said timing means comprises two capacitors coupled in parallel.

10. A one-shot circuit for enabling a phase detector for a clock recovery circuit comprising:

an input means for receiving an input data stream and providing a first output signal;

a timing means coupled to said input means, receiving said first output signal;

a voltage controlling means coupled to said timing means, providing a second output signal to said timing means, also providing a one-shot output signal;

a biasing means coupled to said voltage controlling means for biasing said voltage controlling means for controlling a signal swing across said timing means;

said biasing means coupled to a control voltage wherein said control voltage is also coupled to a voltage controlled oscillator of said clock recovery circuit for controlling a period of a VCO clock signal;

said one-shot circuit having substantially the same core architecture as said VCO of said clock recovery circuit to allow said control voltage to have the same effect on both circuits, said one-shot circuit providing a pulse width of said one-shot output signal that is a ratio of a period of said VCO clock signal.

11. The circuit of claim 10 wherein said timing means comprises two capacitors coupled in parallel and where the length of time of discharging current from said capacitors equals said pulse width of said one-shot output signal.

12. The circuit of claim 11 wherein said pulse width of said one-shot output signal is equal to one-half of said VCO clock period.

13. A clock recovery circuit comprising:
a one-shot receiving an input data stream and providing a delayed data signal;
a phase detector coupled to said one-shot for receiving said delayed data signal to enable said phase detector;
a voltage controlled oscillator coupled to said phase detector for generating a VCO clock signal which is provided to said phase detector for phase comparison with said delayed data signal;
said phase detector disabled after said phase comparison between said delayed data signal and said VCO clock signal;
said one-shot and said VCO are both controlled by a control voltage so that a pulse width of said one-shot is a ratio of said period of said VCO clock signal.

14. The circuit of claim 13 wherein a flip-flop is coupled to said VCO for receiving said VCO clock signal as well as said input data signal for synchronizing said input data signal with said VCO clock signal.

* * * * *